United States Patent [19]

Lever

[11] Patent Number: 5,031,145

[45] Date of Patent: Jul. 9, 1991

[54] SENSE AMPLIFIER

[75] Inventor: Andrew M. Lever, Old Woking, United Kingdom

[73] Assignee: Hughes Microelectronics Limited, Glenrothes, Scotland

[21] Appl. No.: 501,450

[22] Filed: Mar. 29, 1990

[30] Foreign Application Priority Data

Mar. 29, 1989 [GB] United Kingdom ............... 8907045

[51] Int. Cl.[5] ............................................ G11C 11/40
[52] U.S. Cl. .............................. 365/185; 365/189.05; 365/189.07; 365/205; 365/208; 365/210
[58] Field of Search ............... 365/205, 207, 208, 210, 365/189.05, 189.07, 185

[56] References Cited

U.S. PATENT DOCUMENTS 4,845,675  7/1989  Krenik et al. ................... 365/205
4,916,665  4/1990  Atsumi et al. .................. 365/185
4,943,948  7/1990  Morton et al. .................. 365/185

Primary Examiner—Joseph E. Clawson, Jr.
Attorney, Agent, or Firm—Jeannette M. Walder; Terje Gudmestad; W. K. Denson-Low

[57] ABSTRACT

A sense amplifier for determining the logic state of a memory cell consists of a switch transistor (N2) for receiving current during sensing from the memory cell (NV1), a nonvolatile transistor (NV2) providing a reference current which is compared to a representation of the sensed current through the switch transistor (itself dependent on the state of NV1), a bistable latch (N4P4, N5P5) which is switched into one or other of its states depending on the result of the comparison, and a feedback from the output of the latch (NODE 3) to the gate of the switch transistor (N2) to isolate the amplifier from the memory cell after sensing.

7 Claims, 1 Drawing Sheet

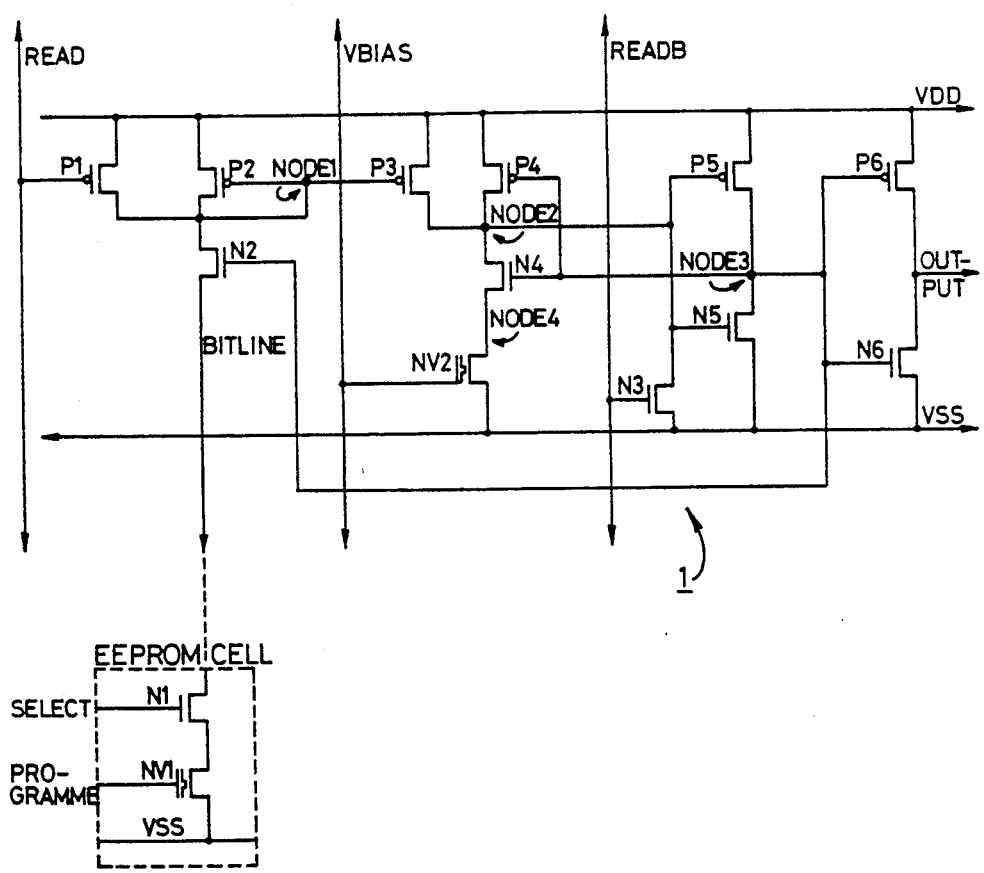

SENSE AMPLIFIER

This invention relates to an amplifier for determining the logic state of a semiconductor memory cell, and particularly of a non-volatile memory cell whose logic state is written, or read, by Fowler-Nordheim tunneling to and from transistor floating gates.

Decoders for reading and sensing the logic state ("0" or "1") of semiconductor memory cells must preferably be fast, consume little current, and take up little chip area in any integrated circuit implementation thereof. The present invention provides such a sensing circuit as an amplifier which uses a statically latched feedback technique to ensure minimum current consumption, and differential current sensing to give speed and ease of integrated circuit processing.

According to the invention, there is provided a sense amplifier for determining the logic state of a semiconductor memory cell, comprising:

switch means for receiving the current passing through said memory cell, said current being at one level representing one logic state of the cell or at a second level, higher than the first level, representing a second logic state of the cell;

comparing means for comparing a representation of said current with a reference current to provide first or second comparison outputs dependent on whether the representation current is above or below said reference current respectively;

latch means responsive to the output of the comparing means and latching into a first output state in response to one of said comparison output states; and feedback means from the output of the latch means to the switch means for switching off the latter to isolate the amplifier in its latched first output state from the memory cell when the current received by the switch means from the memory cell is at said second higher level.

The amplifier according to the present invention has the following advantages:

1. a fully static operation,
2. a latching action which reduces current consumption,
3. logic sensing via current sensing which is faster and less sensitive to bit-line capacitance than voltage sensing,
4. in the preferred embodiment, the use of a reference floating gate transistor for providing the reference current, to provide tolerance to integrated circuit process implementation, and
5. simplicity and small size.

Preferably the representation current is, logically, the same as the current received by the switch means, so that the representation current is higher than the reference current when the current received by the switch means is at said second, higher level (and is lower than the reference current when the current received by the switch means is at the first, or lower level).

This is preferably accomplished by connecting the switch means to a current mirror which supplies the representation current to the comparing means.

A preferred embodiment of the invention will now be described, by way of example, with reference to the accompanying drawing, which illustrates a circuit diagram thereof.

Referring to the drawing, the sense amplifier, generally indicated at 1, is shown connected to a single EEPROM memory cell consisting of a select transistor N1 and a floating gate non-volatile transistor NV1. In practice, the BITLINE of the amplifier would be connected to many such EEPROM cells, and the particular one of the cells to be read would be activated by switching the appropriate N1 on using the SELECT line.

When not reading, all the select transistors, (N1 in each EEPROM cell), are turned off. 'READ' is low and 'READB' is high. Thus both P1 and N3 are turned on. P1 pulls NODE1 high, turning off P2 and P3. N3 is sized such that it can overcome the cross-coupled inverter pair formed by N4, P4, and N5, P5. NODE 2 is pulled low by N3 and NODE3 is high. NV2 is a reference transistor, comprising a non-volatile transistor whose floating gate is connected to external biasing circuitry. This bias is set such that the reference transistor passes either a fixed minimum current or that of a discharged non-volatile transistor, whichever is the higher.

The high state of NODE3 means that N2 will pull the 'BITLINE' up to at least an n-channel threshold with VDD.

During the read operation, 'READ' is set high, 'READB' low, and one of the select transistors on the 'BITLINE' is turned on. This allows the selected transistor to pull current from the 'BITLINE' and through N2 and P2. Once a p-threshold has been established across P2, transistors P2 and P3 act as a current mirror. The current passed by the selected non-volatile transistor is therefore mirrored by P3 and must be passed through N4 and NV2. If the saturated current of the reference transistor NV2 is greater than that of the selected non-volatile transistor then NODE4 stays within millivolts of VSS, NODE2 stays below the threshold of the inverter formed by N5 and P5, NODE3 stays high and the 'OUTPUT' remains low. If however the selected non-volatile transistor current is higher, then NODE4, and also NODE2, rise. Once NODE2 rises above the threshold of the inverter formed by N5 and P5, NODE3 falls and the bistable latch formed by N4, P4 and N5, P5 locks into the state where NODE3 is low, NODE2 is high and the 'OUTPUT' is high. This state is stable and cannot be influenced further by the EEPROM cell. Once NODE3 goes low N2 is turned off, preventing further current drain through P2. Thus if the current drawn by the selected non-volatile transistor is higher than that of the reference transistor, this current will only be passed for a short period. The reference transistor is biased to the higher of either a fixed current, or its discharged current, to ensure sufficient drive to hold NODE4 down (given a spread of natural thresholds on the non-volatile transistors). Ideally the biasing of NV2 would always be VSS such that the transistor to be read is compared with an identical device which is completely discharged.

The sense amplifier of the invention functions best if the natural (discharged) threshold of the non-volatile transistor in the memory cells is in depletion. The effects of programming the cell take the non-volatile transistor further into depletion or reduces the level of depletion (in most cases actually reaching enhancement). These are the two conditions best differentiated by the sense amplifier.

What is claimed is:

1. A sense amplifier for determining the logic state of a memory cell, the memory cell including a floating gate transistor, comprising:

switch means for receiving the current passing through said memory cell, said current being at one level representing one logic state of the cell or at a second level, higher than the first level, representing a second logic state of the cell;

comparing means for comparing a representation of said current with a reference current to provide first or second comparison outputs dependent on whether the representation current is above or below said representation current respectively, wherein said comparing means includes a floating gate transistor and means for biasing said transistor to provide said reference current;

latch means responsive to the output of the comparing means and latching into a first state in response to one of said comparison output states; and feedback means from the output of the latch means to the switch means for switching off the latter to isolate the amplifier in its latched first output state from the memory cell when the current received by the switch means from the memory cell is at said second higher level.

2. An amplifier according to claim 1 further comprising means for providing a representation current which is higher than said reference current when the current received by said switch means is at said second, higher level.

3. An amplifier according to claim 2 wherein the switch means is coupled to a current mirror which supplies said representation current to said comparing means.

4. An amplifier according to claim 1 wherein said switch means comprises an MOS transistor and said feedback means is coupled to a control gate of said transistor.

5. An amplifier according to claim 1 wherein the output of said latch means is connected to the control gates of a pair of series CMOS transistors and wherein the output of said amplifier is provided at the junction of said transistors.

6. An amplifier according to any of claims 1 to 5 in combination with a plurality of memory cells connected to said switch means, select means being provided to enable any one of said memory cells to pass current to said amplifier.

7. A combination according to claim 6 wherein each memory cell comprises a floating gate non-volatile transistor as its memory element.

* * * * *